United States Patent
Lee et al.

(10) Patent No.: US 8,916,482 B2
(45) Date of Patent: Dec. 23, 2014

(54) METHOD OF MAKING A LITHOGRAPHY MASK

(75) Inventors: Hsin-Chang Lee, Hsin-Chu Xian (TW); Yun-Yue Lin, Hsinchu (TW); Hung-Chang Hsieh, Hsin-Chu (TW); Chia-Jen Chen, Jhudong Township, Hsinchu County (TW); Yih-Chen Su, Taichung (TW); Ta-Cheng Lien, Cyonglin Township, Hsinchu County (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 170 days.

(21) Appl. No.: 13/437,075

(22) Filed: Apr. 2, 2012

(65) Prior Publication Data

US 2013/0260573 A1 Oct. 3, 2013

(51) Int. Cl.
*H01L 21/31* (2006.01)

(52) U.S. Cl.
USPC .......................................... 438/763; 438/795

(58) Field of Classification Search
CPC .................. H01L 21/67115; H01L 21/02348; G03F 1/00
USPC ................................................. 438/763, 795
See application file for complete search history.

(56) References Cited

U.S. PATENT DOCUMENTS

| | | | |
|---|---|---|---|
| 5,677,090 A * | 10/1997 | Marumoto et al. | 430/5 |
| 6,265,113 B1 * | 7/2001 | Yabe et al. | 430/5 |
| 6,639,793 B2 | 10/2003 | Lien et al. | |
| 7,906,252 B2 | 3/2011 | Lee et al. | |
| 7,998,645 B2 | 8/2011 | Otsuka et al. | |

OTHER PUBLICATIONS

Hodgkinson, I. J., et al., "Stress Relief Induced in Silicon Oxide films by Ultraviolet Radiation," Thin Solid Films. 17 (1973), p. 185-197.
Imai, Hiroaki, et al., "Densification of Sol-Gel Think Films by Ultraviolet and Vacuum Ultraviolet Irradiations," Journal of Sol-Gel Science and Technology 8, 1997, p. 365-369.

* cited by examiner

*Primary Examiner* — Douglas Menz
(74) *Attorney, Agent, or Firm* — Haynes and Boone, LLP

(57) ABSTRACT

A method of making a lithography mask with a stress-relief treatment is disclosed. The method includes providing a substrate and depositing an opaque layer on the substrate. The opaque layer is patterned to form a patterned mask. A stress-relief treatment is applied to the patterned mask by using an radiation exposure.

12 Claims, 5 Drawing Sheets

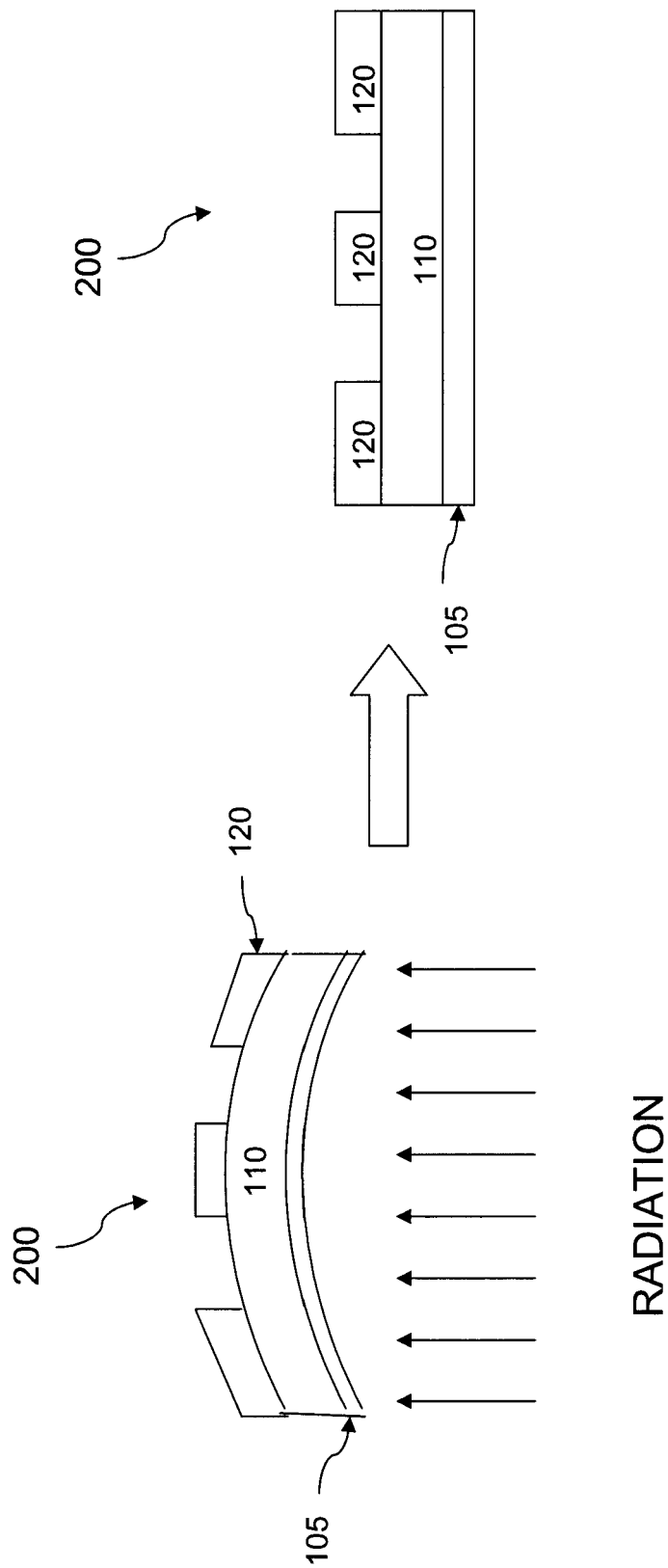

METHOD OF MAKING A LITHOGRAPHY MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a need of obtaining an adequate interlayer overlay raises challenges to control, relieve and compensate a composite stress built up on a lithograph mask during fabrication of the mask. Several approaches of reducing overlay error have been applied, such as an e-beam correction, a charging dissipation layer deposition, and manipulating blank flatness. Accordingly, although existing approaches have been generally adequate for their intended purposes, they have not been entirely satisfactory in all respects. For example, variations of pattern density and device layout from area to area in a lithography mask raise need of a stress compensation solution not only globally (a whole mask) but also locally (a portion of the mask). It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4a and 4b are simplified schematic diagrams of one embodiment of a stress-relief treatment constructed according to aspects of the present disclosure.

DETAILED DESCRIPTION

Figure 1:
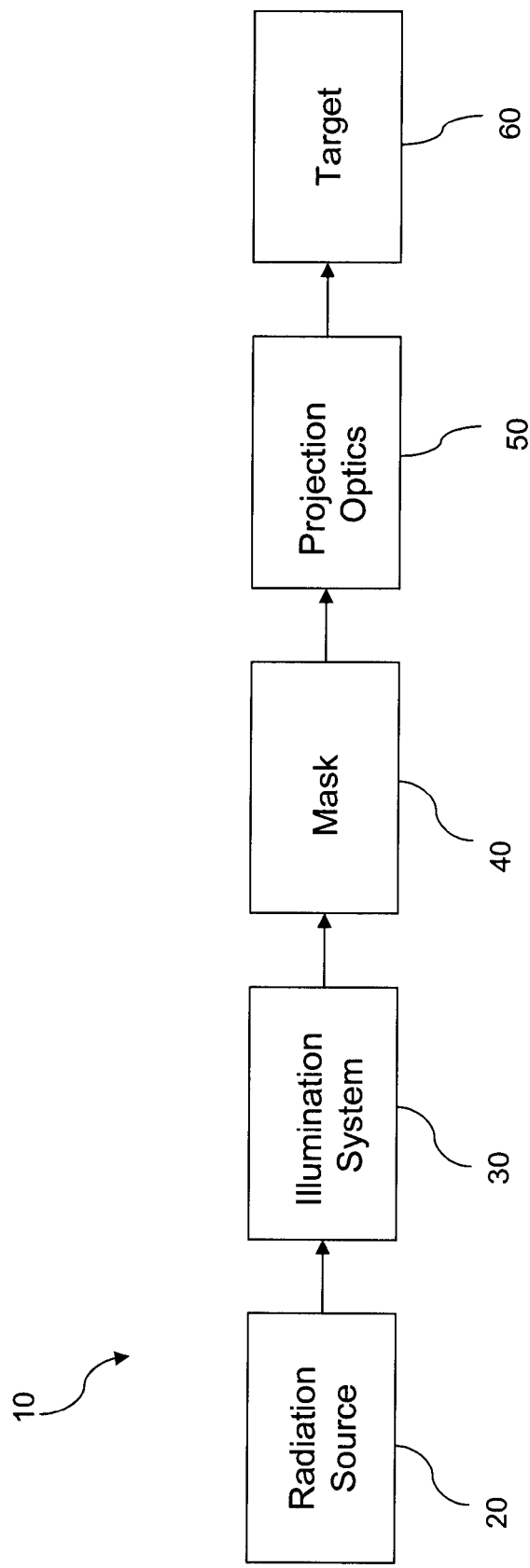
FIG. 1 is a block diagram of a lithography system for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a lithography system 10 includes a radiation source 20, an illumination system 30, a mask 40 (in the present disclosure, the terms of mask, photomask, and reticle are used to refer to the same item), a plurality of projection optics 50 and a target 60 such as a semiconductor wafer on a substrate stage. However, other configurations and inclusion or omission of devices may be possible. In the present embodiment, the radiation source 20 may be any suitable light source, such as a Krypton Fluoride (KrF) excimer laser with wavelength of 248 nm, an Argon Fluoride (ArF) excimer laser with a wavelength of 193 nm, a Fluoride (F2) excimer laser with a wavelength of 157 nm, or other light sources having a longer wavelength. The radiation source 20 may be a continuous wave (CW) type or a pulse type. For example, when a light wavelength is less than about 248 nm, the radiation source 20 can be either a CW type or a pulse type. When a light wavelength is larger than about 248 nm, the radiation source 20 may be a pulse type with a time duration range from millisecond (ms) to femtosecond (fs). The radiation source 20 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The illumination system 30 may comprise refractive optics such as a single lens or a lens system having multiple lenses, and reflective optics such as mirrors. For example, the illumination system 30 may include microlens arrays, shadow masks, and/or other structures designed to aid in directing light from the light source 20 towards the mask 40.

The mask 40 can be a transparent mask or a reflective mask. A transparent mask includes a transparent substrate and a patterned absorption (opaque) layer. A light beam may be partially or completely blocked when directed on an opaque region. The opaque layer may be patterned to have one or more openings through which a light beam may travel through (for a transparent mask) or reflect from a reflective region (for a reflective mask). The mask 40 may incorporate other resolution enhancement techniques such as phase shift mask (PSM) and/or optical proximity correction (OPC), which will be described in further detail later below.

The projection optics 50 may have refractive optics or reflective optics. The projection system 50 directs the patterned radiation towards the target 60 (e.g., a semiconductor wafer). The target 60 includes a photosensitive layer (e.g., photoresist or resist), which is sensitive to the radiation. The target 60 may be held by a target substrate stage. The target substrate stage provides control of the target substrate position such that the image of the reticle is scanned onto the target substrate in a repetitive fashion (though other lithography methods are possible). The lithography system 10 or portion thereof may include a vacuum atmosphere. However, other configurations and inclusion or omission of devices may be possible.

The following description refers to the mask 40 and fabrication of the mask. In the present embodiment, the lithography mask fabrication includes three parts: forming a blank mask, patterning the blank mask to form a patterned mask, and applying a stress-relief treatment to the patterned mask. The blank mask is formed by depositing suitable layers (e.g., multiple reflective layers) on a suitable substrate. The blank mask is patterned to carry out a design of an integrated circuit (IC) device (or chip). The patterned mask receives a stress-relief treatment to control and compensate a composite stress built up during the mask fabrication. After the stress-relief treatment, the patterned mask is used in a lithography process to transfer the circuit patterns onto the target (e.g., wafer). The pattern can be transferred over and over onto multiple wafers through various lithography processes. Several masks (for example, a set of 15 to 30 masks) may be used to construct a complete IC device.

Figure 2:
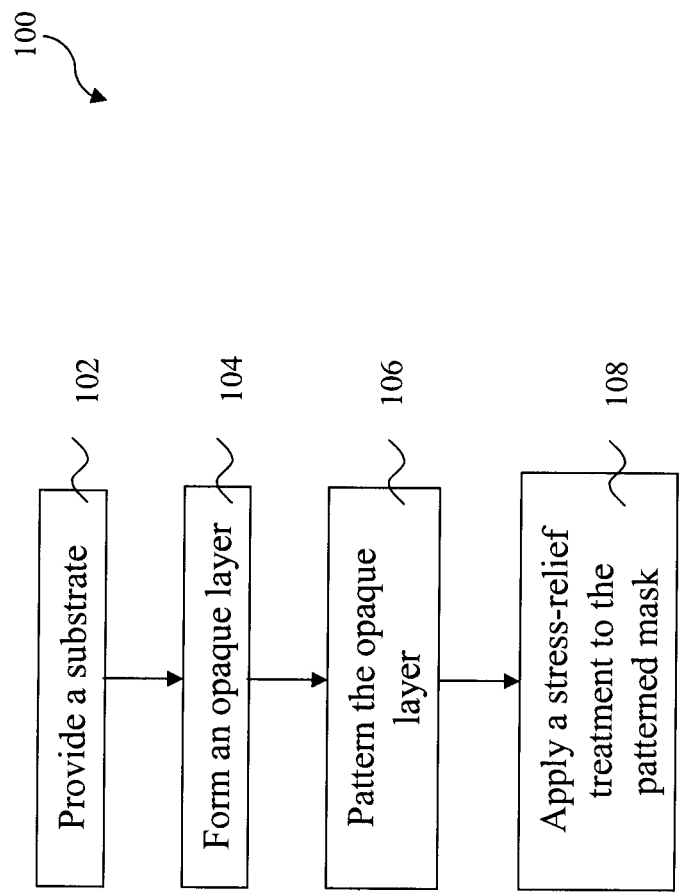
FIG. 2 is a flow chart of an example method for making a lithography mask having a stress-relief treatment constructed according to various aspects of the present disclosure.
Figure 5:
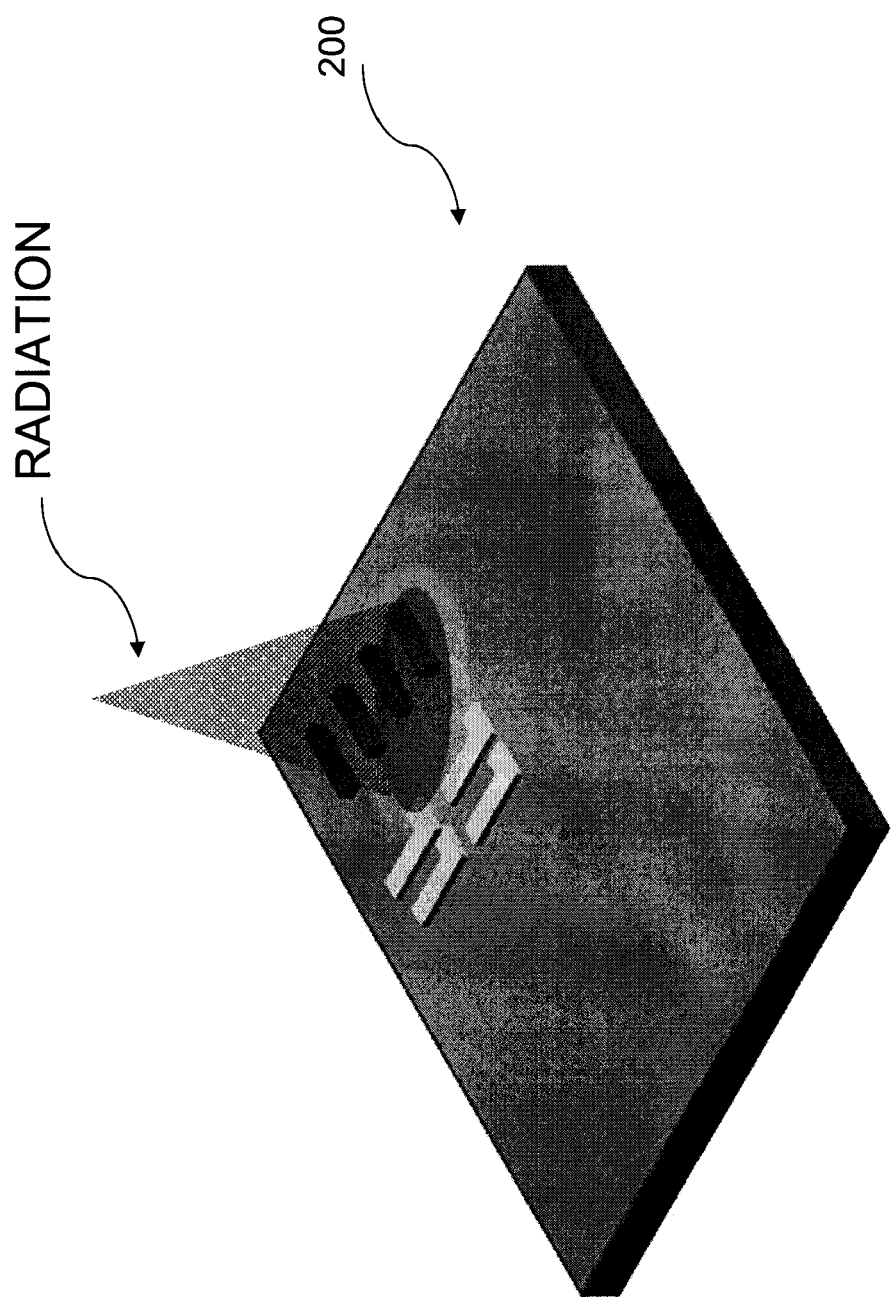
FIG. 5 is another simplified schematic diagram of one embodiment of a stress-relief treatment constructed according to aspects of the present disclosure.

FIG. 2 is a flowchart of a method 100 of making a lithography mask constructed according to aspects of the present disclosure. FIGS. 3 and 5 are sectional views of embodiment of a lithography mask 200 at various fabrication stages of the method 100. The lithography mask 200 and the method 100 of making the same are collectively described with reference to FIGS. 2 through 5.

The method 100 begins at step 102 by providing a substrate 110. The substrate 110 may include a low thermal expansion material (LTEM) glass, quartz, silicon, silicon carbide, black diamond, and/or other low thermal expansion substances known in the art. In the present embodiment, the substrate 110 includes a LTEM substrate to minimize image distortion by mask heating. In addition, a conductive layer 105 may be deposited on the bottom surface of the substrate 110. The conductive layer 105 is operable to provide for electrostatic coupling between the mask and a mask holder or chuck. In an embodiment, the conductive layer 105 includes chromium nitride (CrN), tantalum nitride (TaN), tantalum boron nitride (TaBN), tantalum boron oxide (TaBO), tantalum oxynitride (TaON), though other compositions are possible.

Alternatively, for a reflective mask, the substrate 110 includes a reflective multilayer (not shown) deposited on the LTEM glass. The multilayer (ML) is configured by a large number of alternating layers of materials having a high refractive index and a low refractive index. Pairing these two types of materials together provides a resonant reflectivity. The reflective ML includes a plurality of film pairs, such as molybdenum-silicon (Mo/Si) film pairs (e.g., a layer of molybdenum above or below a layer of silicon in each film pair). A typical number of film pairs is 20-80, however any number of film pairs is possible. An example of a reflective ML is described in U.S. Ser. No. 13/328,166 which is hereby incorporated by reference. Additionally, a capping layer is formed on the ML to prevent oxidation of the ML during a mask patterning process. The capping layer includes ruthenium (Ru), Ru compounds such as RuB and RuSi, silicon dioxide (SiO2), silicon nitride, aluminum oxide, amorphous carbon, or other suitable compositions.

The method 100 proceeds to step 104 by forming an absorption (an opaque) layer 120 and a hard mask 140 on the substrate 110. The opaque layer 120 includes chromium, chromium oxide, aluminum-copper palladium, tantalum nitride, aluminum oxide titanium, tungsten, and/or combinations thereof. The opaque layer 120 is deposited on the substrate 110. The hard mask (HM) 140 serves as an etching mask for a subsequent opaque layer etching for an optimized etching profile and selectivity. The HM 140 includes compound materials such as TaN, TaBO, $Cr_2O_3$, ITO, $SiO_2$, SiN, $TaO_5$, or any suitable material. The HM 140 is deposited on the opaque layer 120.

One or more of the layers 105, ML, 120 and 140 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figures 3A, 3B:
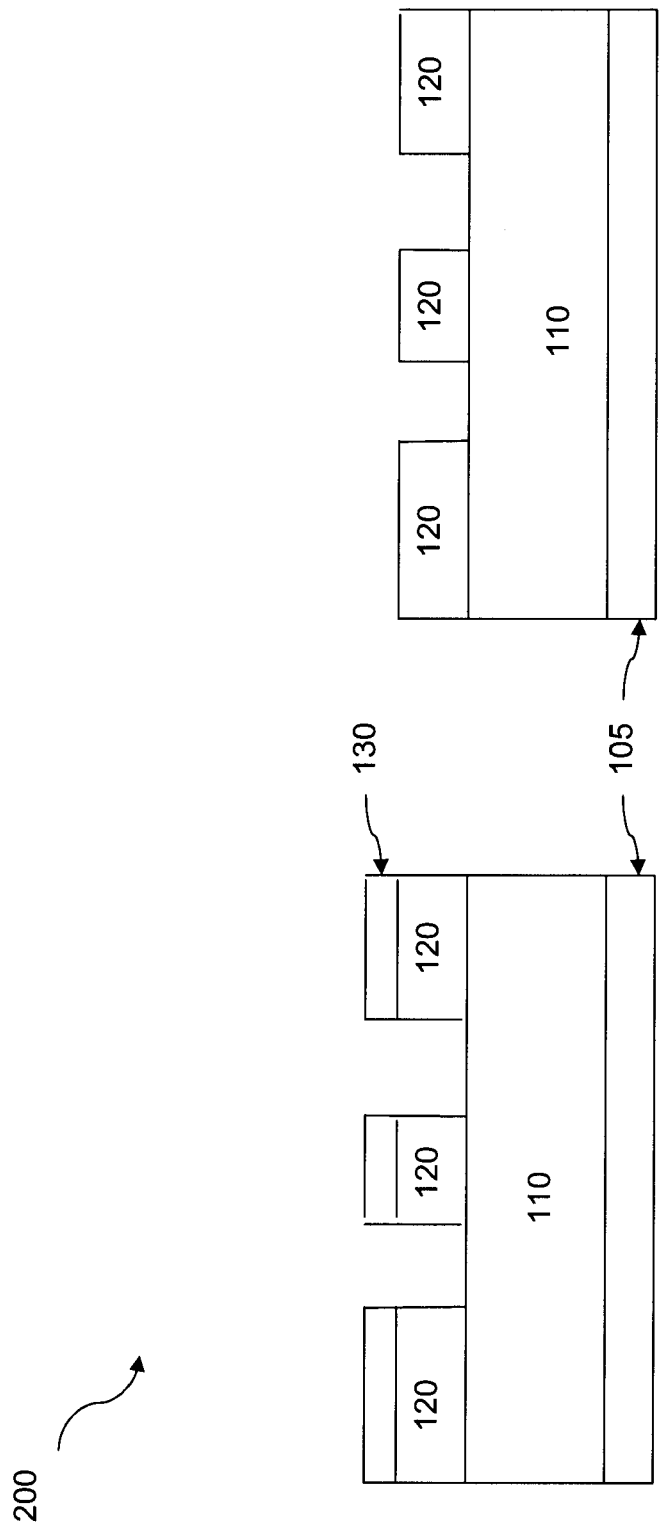
FIGS. 3a and 3b illustrate cross sectional views of various aspects of one embodiment in various stages of making a lithography mask constructed according to aspects of the present disclosure.

The method 100 proceeds to step 106 by patterning the opaque layer 120, as shown in FIG. 3a. First the HM 140 is patterned to form the IC design layout pattern. A patterning process includes a photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing. A first etching process is applied to selectively remove portions of the HM 140 to uncover portions of the opaque layer 120 on the substrate 110. The photoresist layer on the HM 140 may be removed after the first etching.

Referring to FIG. 3b, a second etching process is followed to etch the opaque layer 120 through the patterned HM 140 to form a patterned mask 200. After the second etching, the patterned HM 140 is removed by another etching process. One or more of the layers 140, 120 and photoresist layer may be etched by various methods, include a dry etch, a wet etch, or a combination of dry etch and wet etch. The dry etching process may implement by fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), oxygen-containing gas, iodine-containing gas, other suitable gases and/or plasmas, and/or combinations thereof. The etching process may include a multiple-step etching to gain etch selectivity, flexibility and desired etch profile.

The patterned mask 200 is built by a stack of films, such as the LTEM glasses, the ML, and the opaque layer. Each film in the stack may contribute and accumulate a composite stress of the patterned mask 200. Depending on each film's type, thickness, and receiving conditions during film formations, the composite stress of the patterned mask 200 may be compressive or tensile, which may lead the patterned mask 200 to have an unacceptable convex shape, concave shape or other distortion. The unacceptable shape may be globally (referring to whole mask) or locally (referring to a portion of the mask). The unacceptable shape may cause an overlay error when such a mask is used in a lithography patterning process. Overlay control plays an important role in layer-to-layer alignment on multi-layer device structures. The unacceptable shape also puts constraints on film composition and thickness of the blank mask. Furthermore, an unstable film composition caused by stress brings risks of optical and chemical durability of the patterned mask 200. In the present disclosure, a stress-relief treatment is carried out to compensate for the stress and to control the shape and flatness of the patterned mask 200.

The method 100 proceeds to step 108 by applying a stress-relief by exposing an radiation to the patterned mask 200 for mask shape and flatness control. In one embodiment, the stress-relief treatment is implemented by using a vacuum ultraviolet irradiation (VUVI) to expose the patterned mask 200. A wavelength range of the VUVI used for the stress-relief treatment is from 13.5 nm to 350 nm. The VUV irradiation source may be a lamp, laser, or other suitable source. The VUVI may employ a single beam or a multi-beam. In another embodiment, the stress-relief treatment is implemented by using an radiation source with a longer wavelength than VUVI to expose the patterned mask 200. For example, a wavelength range of the radiation source is from 350 nm to 1064 nm. The radiation source may include laser, lamp or other suitable source. The radiation source may be a CW type or a pulse type with a time duration from ns to fs. The stress-relief treatment may be processed in an environment such as a vacuum, an inert gas or some other atmosphere.

In order to obtain a desired flatness and stress compensation, the stress-relief treatment may be applied on a front side, or a back side of the patterned mask 200. The stress-relief treatment may be applied to the entire patterned mask 200. The stress-relief is equipped with adjustable irradiation beam size, beam intensity and energy to gain an optimized stress relief.

Alternatively, in one embodiment, the stress-relief treatment may be applied on a portion of the patterned mask 200, referred to as a local-stress-relief treatment. In the patterned mask 200, due to variations of received process conditions, pattern feature density and layout may differ from area to area, and the types and magnitudes of the composite stress may vary from area to area. By applying the local-stress-relief treatment, different areas may receive a stress-relief treatment individually with a different irradiation beam size, beam intensity and/or energy to achieve an optimized stress compensation. The irradiation beam size may be from 0.1 μm to 200 mm. A range of the portion area where receiving the local-stress-treatment may be from 1 μm² to the whole patterned mask 200.

The present disclosure provides many different embodiments of making a lithography mask that provide one or more improvements over the prior art. In one embodiment, a method of making a lithography mask includes providing a substrate and depositing an opaque layer on the substrate. The opaque layer is patterned to form a patterned mask. A stress-relief treatment is applied to the patterned mask by using an radiation to the patterned mask.

In another embodiment, a method of making a lithography mask includes providing a low thermal expansion material (LTEM) substrate. An opaque layer is deposited on the LTEM substrate. A hard mask (HM) is deposited on the opaque layer. The HM is patterned and an etching is followed to etch the opaque layer through the HM to form a patterned mask. After removing the HM, a VUVI stress-relief treatment is applied to the patterned mask with a wavelength range from 13.5 nm to 350 nm.

In yet another embodiment, a method of making lithography mask includes providing a substrate with a reflective multilayer (ML) as the topmost layer of the substrate. A conductive chromium nitride (CrN) layer is coated at the bottom surface of the substrate. An opaque layer is formed on the ML. A hard mask (HM) is formed on the opaque layer. The HM is patterned and an etching is followed to pattern the opaque layer. After removing the HM, a stress-relief treatment is applied to the patterned mask. the patterned mask by exposing an radiation to the patterned mask. The radiation has a wavelength range from about 13.5 nm to about 1064 nm. The stress-relief treatment is applied to one of the two surfaces of the patterned mask.

Based on the above, it can be seen that the present disclosure offers a method of making lithography mask with a stress-relief treatment by using an radiation exposure to relief and compensate stress on a patterned mask. The method provides solutions for both globally and locally stress relief of the patterned mask. By equipped with adjustable irradiation beam size, beam intensity and energy, the method provides a designable local-stress-treatment to areas having various pattern feature density and device layout. The method has demonstrated improvements of mask flatness and overlay performance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a lithography mask comprising:
   providing a substrate;
   forming an opaque layer on the substrate;
   patterning the opaque layer to form a patterned mask; and
   selectively applying a stress-relief treatment to different portions of the patterned mask by exposing the different portions to a radiation.

2. The method of claim 1, wherein the substrate includes a reflective multilayer (ML) deposited as a topmost layer of the substrate.

3. The method of claim 1, wherein the stress-relief treatment uses a vacuum ultraviolet irradiation (VUVI) to expose the patterned mask.

4. The method of claim 3, wherein the VUVI has a wavelength range from about 13.5 nm to about 350 nm.

5. The method of claim 1, wherein the stress-relief treatment uses a radiation source with a wavelength greater than 350 nm.

6. The method of claim 1, wherein the stress-relief treatment is applied on a front side of the patterned mask.

7. The method of claim 1, wherein the stress-relief treatment is applied on a back side of the patterned mask.

8. The method of claim 1, wherein the stress-relief treatment is applied simultaneously to the entire patterned mask.

9. The method of claim 1, wherein a size of the different portions that receive the stress-relief treatment is from about 1 square micron to a majority of the patterned mask.

10. The method of claim 1, wherein selectively applying the stress-relief treatment to the different portions comprises:
    adjusting at least one of a beam size, beam intensity, and energy for the stress-relief treatment differently for each of the different portions.

11. The method of claim 10, wherein a beam size range of the VUVI is from about 0.1 μm to about 200 mm.

12. The method of claim 1, wherein a radiation source used by the stress-relief treatment includes one or more from the group consisting of lamp and laser.

\* \* \* \* \*